United States Patent
Watanabe et al.

(10) Patent No.: US 6,433,428 B1
(45) Date of Patent: Aug. 13, 2002

(54) SEMICONDUCTOR DEVICE WITH A DUAL DAMASCENE TYPE VIA CONTACT STRUCTURE AND METHOD FOR THE MANUFACTURE OF SAME

(75) Inventors: Toru Watanabe, Yokkaichi; Katsuya Okumura, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/086,958

(22) Filed: May 29, 1998

(51) Int. Cl.[7] .............................................. H01L 23/48
(52) U.S. Cl. ...................... 257/750; 257/773
(58) Field of Search ................. 257/635, 636, 257/640, 647, 648, 762, 748, 750, 751, 752, 765, 773, 774, 775; 438/620, 638, 640, 643, 646, 648, 672, 688

(56) References Cited

U.S. PATENT DOCUMENTS

| | | | |
|---|---|---|---|
| 4,087,314 A | 5/1978 | George et al. ............... 156/643 |
| 4,630,357 A | 12/1986 | Rogers et al. ................. 29/590 |
| 4,670,967 A | 6/1987 | Hazuki ......................... 29/576 |
| 4,786,962 A | 11/1988 | Koch ........................... 357/71 |
| 5,409,861 A | 4/1995 | Choi ........................... 437/195 |
| 5,444,022 A | 8/1995 | Gardner ...................... 437/195 |
| 5,470,790 A | 11/1995 | Myers et al. ................. 437/192 |
| 5,561,084 A | 10/1996 | Takata ......................... 437/195 |
| 5,567,650 A | 10/1996 | Straight et al. ............. 437/195 |
| 5,612,254 A * | 3/1997 | Mu et al. ..................... 437/195 |
| 5,693,563 A * | 12/1997 | Teong .......................... 438/627 |
| 5,897,369 A * | 4/1999 | Jun ............................. 438/629 |
| 5,989,623 A * | 11/1999 | Chen et al. .................... 427/97 |
| 6,030,895 A * | 2/2000 | Joshi et al. ................. 438/679 |

FOREIGN PATENT DOCUMENTS

JP 11307636 A * 11/1999 ......... H01L/21/768

* cited by examiner

Primary Examiner—Olik Chaudhuri
Assistant Examiner—Ginette Peralta
(74) Attorney, Agent, or Firm—Banner & Witcoff, Ltd.

(57) ABSTRACT

The via contact structure is rendered into a dual damascene type via contact structure having a wide groove and a via contact hole lying below the wide groove, and the interior of the lower via contact hole is filled up with a filling material composed of tungsten, while, the interior of the upper groove is filled up with aluminum. Since the interior of the lower via contact hole is thus filled up with a filling material comprising tungsten, aluminum which has a low reflowability may be used only in the upper groove. As for the filling material for filling up the wide groove, the wide groove can be filled up sufficiently well even with aluminum which is not high in reflowability. By combining the filling of the via contact hole with tungsten and the filling of the groove with aluminum as mentioned above, a via contact filling with a high aspect ratio can be realized. Further, the problem or drawback that, at the time of forming the second metal wiring layer, the first metal wiring layer may be melted due to the high-temperature heat treatment performed for depositing the metal material is eliminated, and thus, it becomes possible to realize a dual damascene type via contact structure which can be applied to a multi-layer wiring structure.

16 Claims, 13 Drawing Sheets

SEMICONDUCTOR DEVICE WITH A DUAL DAMASCENE TYPE VIA CONTACT STRUCTURE AND METHOD FOR THE MANUFACTURE OF SAME

BACKGROUND OF THE INVENTION

The present invention relates to a semiconductor device with a dual damascene type via contact structure and a method for the manufacture of same and, more particularly, to an improvement in or relating to the via contact filling layer portion of the semiconductor device.

For the formation of wiring layers, the damascene technique has so far been employed. The manufacturing steps thereof are simple, and in addition, it is required to apply no RIE treatment step to the metal layers. It is difficult to form fine metal patterns by the use of the RIE step.

FIGS. 27 to 33 are, respectively, sectional views showing the structure at the respective manufacturing steps in the case of forming a via contact wiring structure by the use of the RIE method. FIGS. 34 to 39 are, respectively, sectional views showing the structure at the respective manufacturing steps in the case of forming a dual damascene type via contact by the use of the damascene method.

According to the RIE method, first, on the upper surface of a semiconductor substrate 12 on which a first metal wiring layer, normally an aluminum wiring layer 22 is formed, a first inter-layered insulation film 24 is formed by the use of the CVD (Chemical Vapor Deposition) method as shown in FIG. 27 (Step 1). Next, as shown in FIG. 28, a via contact hole 32 is formed by performing an RIE treatment in the inter-layered insulation film 24 (Step 2). Between the semiconductor substrate 12 and the first aluminum wiring layer 22, a barrier layer 14 composed of $SiO_2$ is provided. Subsequently, as shown in FIG. 29, tungsten is deposited, by the use of the sputtering method, to form a tungsten layer 62 over the whole surface of the semiconductor substrate 12 having the structure processed as mentioned above, whereby the via contact hole 32 is filled up with said tungsten as shown in FIG. 29 (Step 3), Then, the tungsten on the upper surface of the inter-layered insulation film 24 is removed by performing a CMP (Chemical-Mechanical Polishing) treatment, so that, as shown in FIG. 30, the tungsten is left only in the via contact hole to form a via contact filling layer 38 (Step 4). Subsequently, on the whole upper surface of the semiconductor substrate 12 having the structure thus processed, a metal wiring material, which is normally aluminum, is deposited by the use of the CVD method or the sputtering method, whereby a metal wiring material layer 64 is formed as shown in FIG. 31 (Step 5). Then, the thus formed metal wiring material layer 64 is patterned by an RIE treatment to form a second metal wiring layer 66 as shown in FIG. 32 (Step 6). Subsequently, over the whole surface of the semiconductor substrate 12 having the structure thus processed, a second inter-layered insulation film 68 is formed by the use of the CVD method (Step 7).

On the other hand, in the case of employing the damascene method, first, as shown in FIG. 34, a first thick inter-layered insulation film 24 is formed, by the use of the CVD method, on the upper surface of a semiconductor substrate 12 on which a first metal wiring layer 22, normally an aluminum wiring layer, is formed (Step 1). Then, as shown in FIG. 35, on the inter-layered insulation film 24 thus formed, a via contact hole 32 is formed by an RIE treatment (Step 2). Next, as shown in FIG. 36, a shallow wiring groove 28 is formed, by an RIE treatment, in a portion of the inter-layered insulation film 24 which portion includes the upper portion of the via contact hole. As a result, there is formed a dual damascene type via contact structure having a groove 28 and a via contact hole 26 lying below the groove 28. Subsequently, tungsten is deposited, by the use of the sputtering method, to form a tungsten layer 72 over the whole surface of the semiconductor substrate 12 having the structure processed as mentioned above, whereby the groove 28 and the via contact hole 26 are filled up with the tungsten as shown in FIG. 37 (Step 4). Then, the portion of the tungsten lying on the upper surface of the inter-layered insulation film 24 is removed by a CMP treatment, whereby a second metal wiring layer 74 composed of tungsten is formed in the groove and the via contact hole as shown in FIG. 38 (Step 5). Next, as shown in FIG. 39, over the whole surface of the semiconductor substrate 12 having the structure processed as mentioned above, a second inter-layered insulation film 48 is formed by the use of the CVD method (Step 6).

As may be apparent from the foregoing description concerning the RIE method and the damascene method, the number of manufacturing steps is smaller in the case of the damascene method than in the case of the RIE method. Further, the damascenene method is suited for the formation of fine metal patterns, too. As stated above, the damascenene method is superior in many points to the RIE method, but the damascene method has the following defects:

That is, in case the dual damscene groove and the via contact hole are to be filled up with aluminum, the bottom portion of the via contact hole which has a high aspect ratio (height/width ratio) can hardly be filled up since the reflowability of the aluminum is not so high. If the temperature at the time of depositing the aluminum is enhanced, then the reflowability of the aluminum is increased, but, if the temperature is made too high, then the aluminum will become round due to its surface tension. That is, it is difficult to obtain a via contact filling having a high aspect ratio by the use of aluminum. On the other hand, tungsten has a high reflowability and therefore can fill up even the bottom portion of the via contact hole having a high aspect ratio, but the wiring resistance of tungsten is high.

As described above, in the case of the conventional dual damascene type via contact wiring structure, if the via contact hole is to be filled up with aluminum, it is difficult to fill up the via contact hole, which has a high aspect ratio, as far as its bottom portion. On the other hand, in case the via contact hole is filled up with tungsten, the wiring resistance becomes high. Due to this, the conventional dual damascene formation method is not applicable to the formation of a multi-layer wiring structure.

As described above, in the formation of the conventional dual damascene type via contact structure, it is difficult to fill up the via contact hole which has a high aspect ratio as far as its bottom portion by the use of the metal material due to the lowness in reflowability of the metal. Further, tungsten is used as the metal material, the wiring resistance become high, which is quite a problem.

BRIEF SUMMARY OF THE INVENTION

The present invention has been made in view of these circumstances, and it is the object of the invention to provide a semiconductor device with a dual damascene type via contact structure which is constituted in such a manner that the via contact hole having a high aspect ratio can be filled up as far as its bottom portion with the metal material, and the conventional problem or defect that, due to the high-temperature heat treatment performed at the time of depositing a metal material for the formation of the second metal wiring, the first metal wiring layer is melted is eliminated, so that the application of the dual damascene type via contact structure to a multi-layer wiring structure becomes possible.

In order to achieve the object mentioned above, a semiconductor device with a dual damascene type via contact structure according to the present invention comprises a first metal wiring formed on a semiconductor substrate; an inter-layered insulation film formed on the semiconductor substrate including the first metal wiring; a dual damascene structure having a groove and a via contact hole which are formed in the inter-layered insulation film and lead to the first metal wiring; a via contact filling layer formed by filling up, with a metal material, the interior of the via contact hole of the dual damascene structure formed in the inter-layered insulation film, the via contact filling layer being contacted with the first metal wiring; and a second metal wiring formed in the groove of the dual damascene structure, the groove being contacted with the via contact filling layer.

In the semiconductor device with a dual damascene type via contact structure according to the present invention, the first metal wiring may have a groove formed in the surface area thereof through the groove and the via contact hole of the dual damascene structure, and the filling material may fill up the interior of the groove in the surface area of the first metal layer.

In the semiconductor device with a dual damascene type via contact structure according to the present invention, the via contact filling layer may be formed in the shape of a rivet.

In the semiconductor device with a dual damascene type via contact structure according to the present invention, the via contact filling layer may be composed of a metal which has a high reflowability.

In the semiconductor device with a dual damascene type via contact structure according to the present invention, the via contact filling layer may be composed of a metal which has a low thermal conductivity.

In the semiconductor device with a dual damascene type via contact structure according to the present invention, the first metal wiring and the second metal wiring may be composed of a metal which has a high electrical conductivity.

In the semiconductor device with a dual damascene type via contact structure according to the present invention, the semiconductor device may further comprise a barrier layer formed on the via contact filling layer and the inter-layered insulation film.

In the semiconductor device with a dual damascene type via contact structure according to the present invention, the barrier layer may be composed of Ti, TiN or WN.

Another semiconductor device with a dual damascene type via contact structure comprises an inter-layered insulation film formed on an underlying wiring; a dual damascene structure having a groove and a via contact hole which are formed in the inter-layered insulation film and lead to the underlying wiring; a groove formed in the surface area of the underlying wiring through the groove and the via contact hole of the dual damascene structure; a rivet shape via contact filling layer formed in such a manner that the interior of the via contact hole of the dual damascene structure formed in the inter-layered insulation film and the interior of the groove of the dual damascene structure formed in the surface area of the underlying wiring are filled up with a filling material until the via contact filling layer extends upward from the upper surface of the via contact hole and extends around the upper surface of the via contact hole; and an upper-layered wiring formed in the groove of the dual damascene structure, the upper-layered wiring being contacted with the via contact filling layer.

In the semiconductor device with a dual damascene type via contact structure according to the present invention, the via contact filling layer may be composed of a metal which has a high reflowability.

In the semiconductor device with a dual damascene type via contact structure according to the present invention, the via contact filling layer may be composed of a metal which has a low thermal conductivity.

In the semiconductor device with a dual damascene type via contact structure according to the present invention, the underlying wiring and the upper-layer wiring may be composed of a metal which has a high electrical conductivity.

In the semiconductor device with a dual damascene type via contact structure according to the present invention, the semiconductor device may further comprise a barrier layer formed on the via contact filling layer and the inter-layered insulation film.

In the semiconductor device with a dual damascene type via contact structure according to the present invention, the barrier layer may be composed of Ti, TiN or WN.

A method for the manufacture of a semiconductor device with a dual damascene type via contact structure, comprises the step of forming a first metal wiring on a semiconductor substrate; the step of forming an inter-layered insulation film over the semiconductor substrate including the first metal wiring; the step of forming, in the inter-layered insulation film, a dual damscene structure having a groove and a via contact hole which lead to the first metal wiring; the step of filling up, with a filling material, the interior of the via contact hole of the dual damascene structure formed in the inter-layered insulation film to form a via contact filling layer contacted with the first metal wiring; and the step of forming, in the groove of the dual damscene structure, a second metal wiring contacted with the via contact filling layer.

In the method for the manufacture of a semiconductor device with a dual damscene type via contact structure according to the present invention, the filling material may be deposited for filling up the interior of the via contact hole of the dual damascene structure by the use of the selective CVD method.

In the method for the manufacture of a semiconductor device with a dual damascene type via contact structure according to the present invention, the via contact hole of the dual damascene structure may be filled up with the filling material to form the via contact filling layer in the via contact hole until the via contact filling layer extends up to the upper surface of the via contact hole.

In the method for the manufacture of a semiconductor device with a dual damascene type via contact structure according to the present invention, the via contact hole may be filled up with the filling material to form the via contact filling layer in the via contact hole until the via contact filling layer is formed only within the extent of the upper surface of the via contact hole and extends upward from the upper surface of the via contact hole.

In the method for the manufacture of a semiconductor device with a dual damascene type via contact structure according to the present invention, the via contact hole may be filled up with the filling material to form a via contact filling layer in the via contact hole until the via contact filling layer extends upward from the upper surface of the via contact hole and extends beyond the extent of the upper surface of the via contact hole and onto the peripheral portion adjacent to the upper surface of the via contact hole.

In the method for the manufacture of a semiconductor device with a dual damascene type via contact structure according to the present invention, the method may further comprise the step, performed following the step of forming the groove and the via contact hole of the dual damascene structure in the inter-layered insulation film, of forming a groove in the surface area of the first metal wiring through the groove and the via contact hole of the dual damascene structure, and, in the step of forming in the via contact hole formed in the inter-layered insulation film the via contact filling layer contacted with the first metal wiring, even the interior of the groove in the surface area of the first metal wiring may be filled up with the filling material.

In the method for the manufacture of a semiconductor device with a dual damascene type via contact structure according to the present invention, the groove formed in the surface area of the first metal wiring may be formed by isotropically etching the first metal wiring through the groove and the via contact hole of the dual damascene structure.

In the method for the manufacture of a semiconductor device with a dual damascene type via contact structure according to the present invention, the groove formed in the surface area of the first metal wiring may be formed only in the extent of the lower surface of the via contact hole.

In the method for the manufacture of a semiconductor device with a dual damascene type via contact structure according to the present invention, the groove formed in the surface area of the first metal wiring may extend beyond the extent of the lower surface of the via contact hole and onto the peripheral portion adjacent to the lower surface of the via contact hole.

In the method for the manufacture of a semiconductor device with a dual damascene type via contact structure according to the present invention, the interior of the groove formed in the surface area of the first metal wiring and the via contact hole may be filled up with the filling material to form the via contact filling layer until the via contact filling layer extends up to the upper surface of the via contact hole.

In the method for the manufacture of a semiconductor device with a dual damascene type via contact structure according to the present invention, the interior of the groove formed in the surface area of the first metal wiring and the via contact hole may be filled up with the filling material to form the via contact filling layer until the via contact filling layer extends upward from the upper surface of the via contact hole.

In the method for the manufacture of a semiconductor device with a dual damascene type via contact structure according to the present invention, the interior of the groove formed in the surface area of the first metal wiring and the via contact hole may be filled up with the filling material to form the via contact filling layer until the via contact filling layer extends beyond the upper surface of the via contact hole and onto the peripheral portion adjacent to the upper surface of the via contact hole and extends upward from the upper surface of the via contact hole.

In the method for the manufacture of a semiconductor device with a dual damascene type via contact structure according to the present invention, the via contact filling layer may be formed in the shape of a rivet.

In the method for the manufacture of a semiconductor device with a dual damascene type via contact structure according to the present invention, the via contact filling layer may be composed of a metal which has a high reflowability.

In the method for the manufacture of a semiconductor device with a dual damascene type via contact structure according to the present invention, the via contact filling layer may be composed of a metal which has a low thermal conductivity.

In the method for the manufacture of a semiconductor device with a dual damascene type via contact structure according to the present invention, the via contact filling layer may be composed of tungsten.

In the method for the manufacture of a semiconductor device with a dual damascene type via contact structure according to the present invention, the via contact filling layer may be composed of copper.

In the method for the manufacture of a semiconductor device with a dual damascene type via contact structure according to the present invention, the first metal wiring and the second metal wiring may be composed of a metal which has a high electrical conductivity.

In the method for the manufacture of a semiconductor device with a dual damascene type via contact structure according to the present invention, the first metal wiring and the second metal wiring may be composed of aluminum.

In the method for the manufacture of a semiconductor device with a dual damascene type via contact structure according to the present invention, the first metal wiring and the second metal wiring may be composed of an aluminum compound.

In the method for the manufacture of a semiconductor device with a dual damascene type via contact structure according to the present invention, the method further may comprise the step, performed following the step of forming the via contact filling layer, of forming a barrier layer on the via contact filling layer and the inter-layered insulation film.

In the method for the manufacture of a semiconductor device with a dual damascene type via contact structure according to the present invention, the barrier layer may be composed of Ti, TiN or WN.

In the method for the manufacture of a semiconductor device with a dual damascene type via contact structure according to the present invention, the step of forming the second metal wiring may comprise the step of forming a metal layer by depositing a metal material in the groove and on the inter-layered insulation film; and the step of polishing the formed metal layer to leave only the metal layer portion in the groove.

In the method for the manufacture of a semiconductor device with a dual damascene type via contact structure according to the present invention, the metal layer may be formed in such a manner that the metal material is deposited in the groove and on the inter-layered insulation film by the use of the CVD method.

In the method for the manufacture of a semiconductor device with a dual damascene type via contact structure according to the present invention, the step of leaving only the metal layer portion in the groove may comprise the step of polishing, by the use of the CMP method, the metal layer formed in the metal layer forming step.

Another method for the manufacture of a semiconductor device with a dual damascene type via contact structure according to a fourth aspect of the present invention, comprises the step of forming an inter-layered insulation film on an underlying wiring; the step of forming, in the inter-layered insulation film, a dual damascene structure having a groove and a via contact hole which lead to the underlying wiring; the step of forming a groove in the surface area of the underlying wiring through the groove and the via contact hole of the dual damascene structure; the step of filling a filling material into the interior of the via contact hole formed in the inter-layered insulation film and the interior of the groove formed in the surface area of the underlying wiring to form a via contact filling layer until the via contact filling layer extends upwardly from the via contact hole so that the via contact filling layer has a rivet-shape; and the step of forming, in the groove of the dual damscene structure, an upper-layered wiring contacted with the via contact filling layer.

In the method for the manufacture of a semiconductor device with a dual damascene type via contact structure according to the present invention, the filling material may be filled by the use of the selective CVD method.

In the method for the manufacture of a semiconductor device with a dual damascene type via contact structure according to the present invention, the groove in the surface area of the underlying wiring may be formed by isotopically etching the underlying wiring through the groove and the via contact hole of the dual damascene structure.

In the method for the manufacture of a semiconductor device with a dual damascene type via contact structure according to the present invention, the via contact filling layer may be composed of a metal which has a high reflowability.

In the method for the manufacture of a semiconductor device with a dual damascene type via contact structure according to the present invention, the via contact filling layer may be composed of a metal which has a low thermal conductivity.

In the method for the manufacture of a semiconductor device with a dual damascene type via contact structure according to the present invention, the underlying wiring and the upper-layer wiring may be composed of a metal which has a high electrical conductivity.

In the method for the manufacture of a semiconductor device with a dual damascene type via contact structure according to the present invention, the method may further comprise the step, following the step of forming the via contact filling layer, of forming a barrier layer on the via contact filling layer and the inter-layered insulation film.

In the method for the manufacture of a semiconductor device with a dual damascene type via contact structure according to the present invention, the barrier layer may be composed of Ti, TiN or WN.

In the method for the manufacture of a semiconductor device with a dual damascene type via contact structure according to the present invention, the step of forming the upper-layer wiring may comprise the step of forming a metal layer by depositing a metal material in the groove and on the inter-layered insulation film; and the step of polishing the thus formed metal layer to leave only the metal layer portion in the groove.

In the method for the manufacture of a semiconductor device with a dual damascene type via contact structure according to the present invention, the metal layer may be formed by depositing the metal material in the groove and on the inter-layered insulation film by the use of the CVD method.

In the method for the manufacture of a semiconductor device with a dual damascene type via contact structure according to the present invention, the step of leaving only the metal layer portion in the groove may comprise the step of polishing, by the use of the CVD method, the metal layer formed at the metal layer formation step.

In the method for the manufacture of a semiconductor device with a dual damascene type via contact structure according to the present invention, the groove formed in the surface area of the first metal wiring may be formed only in the extent of the lower surface of the via contact hole.

In the method for the manufacture of a semiconductor device with a dual damascene type via contact structure according to the present invention, the groove formed in the surface area of the first metal wiring may extend beyond the extent of the lower surface of the via contact hole and onto the peripheral portion adjacent to the lower surface of the via contact hole.

In the method for the manufacture of a semiconductor device with a dual damascene type via contact structure according to the present invention, the via contact filling layer may be composed of tungsten.

In the method for the manufacture of a semiconductor device with a dual damascene type via contact structure according to the present invention, the via contact filling layer may be composed of copper.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The semiconductor device having a dual damascene type via contact structure according to an embodiment of the present invention and a method for the manufacture of the semiconductor device will now be described by reference to the drawings.

Figure 1:
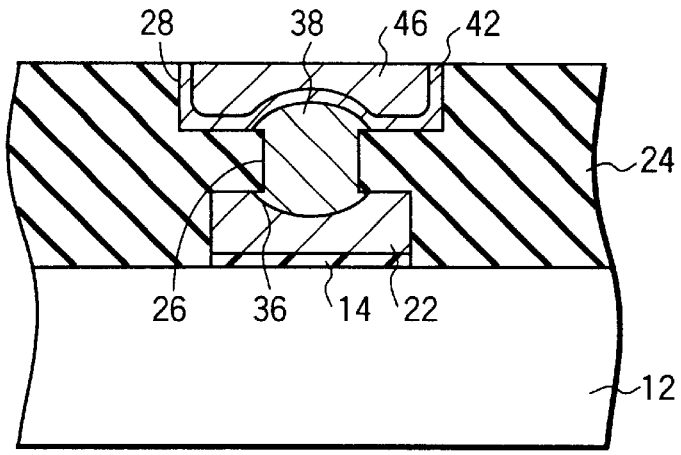
FIG. 1 is a sectional view of the semiconductor device having a dual damascene type via contact structure according to the present invention.

FIG. 1 is a sectional view showing the semiconductor device having a dual damascene type via contact structure according to an embodiment of the present invention. FIGS. 2 to 14 are, respectively, sectional views showing the device structure at the respective manufacturing steps of the method for the manufacture of the semiconductor device shown in FIG. 1.

Figure 2:
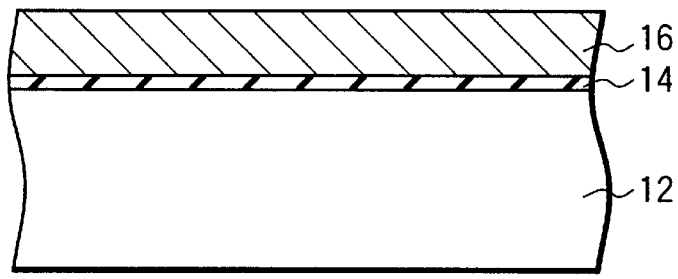
FIG. 2 is a sectional view showing the semiconductor device at a manufacturing step of the method for the manufacture of the semiconductor device shown in FIG. 1.
Figure 3:
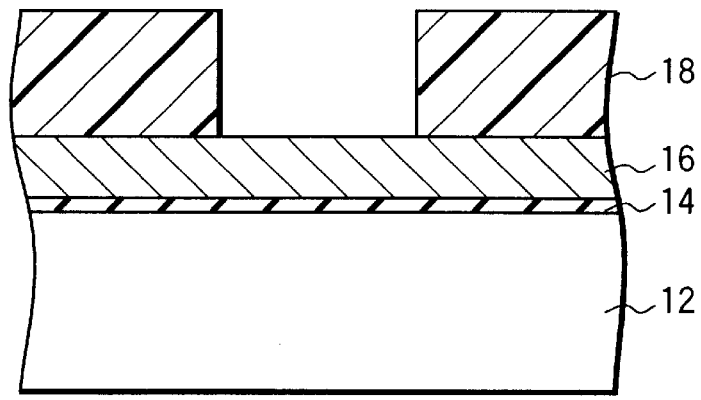
FIG. 3 is a sectional view showing the semiconductor device at another manufacturing step of the method for the manufacture of the semiconductor device shown in FIG. 1.
Figure 4:
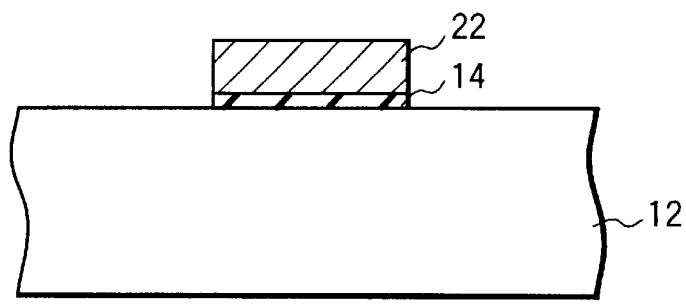
FIG. 4 is a sectional view showing the semiconductor device at still another manufacturing step of the method for the manufacture of the semiconductor device shown in FIG. 1.
Figure 5:
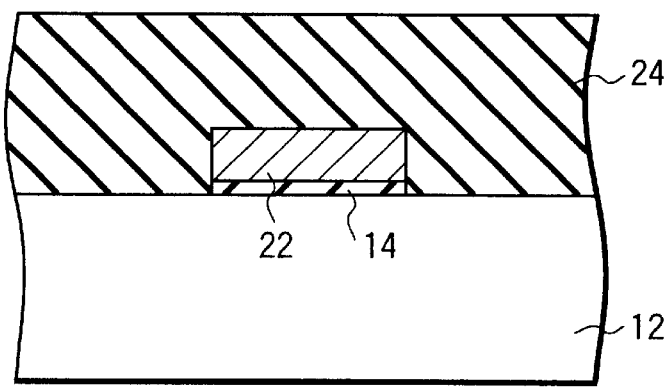
FIG. 5 is a sectional view showing the semiconductor device at still another manufacturing step of the method for the manufacture of the semiconductor device shown in FIG. 1.
Figure 6:
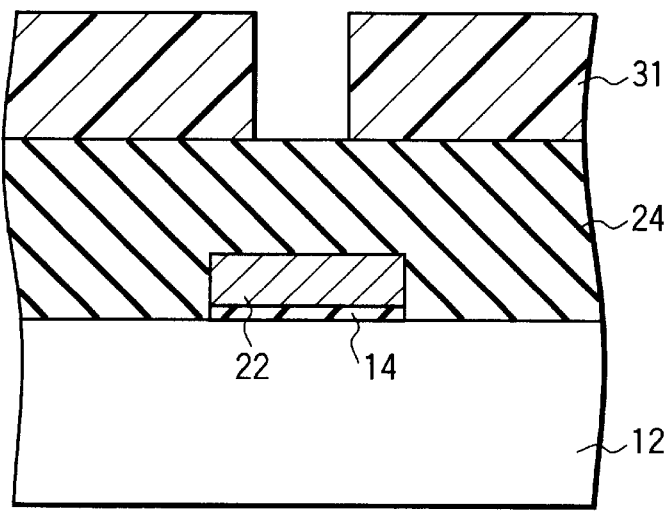
FIG. 6 is a sectional view showing the semiconductor device at still another manufacturing step of the method for the manufacture of the semiconductor device shown in FIG. 1.
Figure 7:
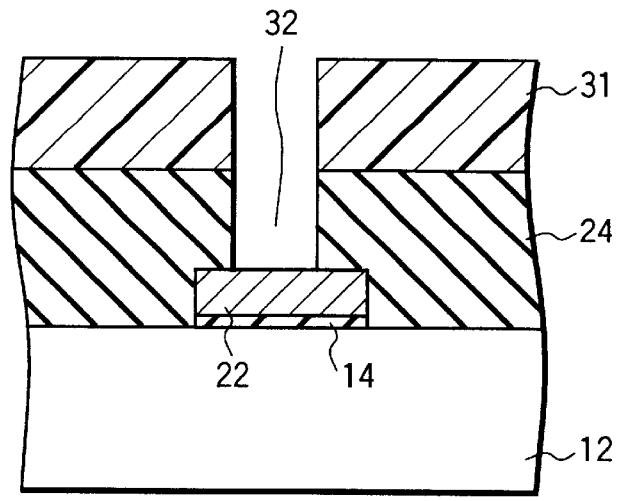
FIG. 7 is a sectional view showing the semiconductor device at still another manufacturing step of the method for the manufacture of the semiconductor device shown in FIG. 1.
Figure 8:
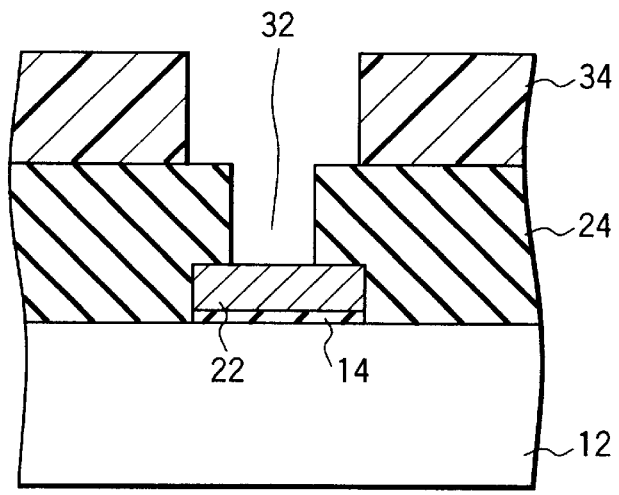
FIG. 8 is a sectional view showing the semiconductor device at still another manufacturing step of the method for the manufacture of the semiconductor device shown in FIG. 1.
Figure 9:
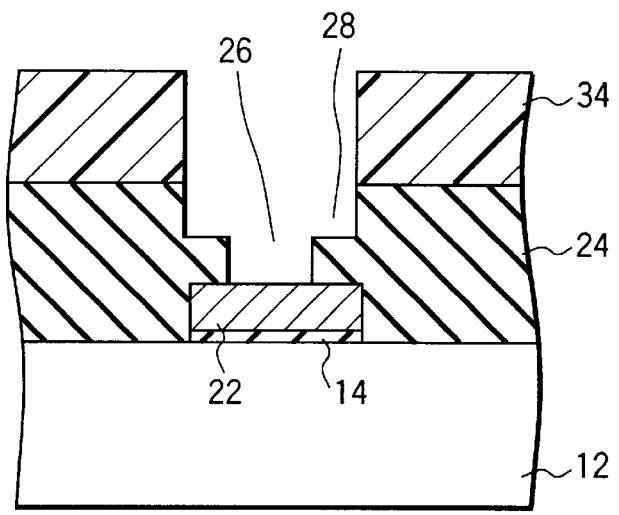
FIG. 9 is a sectional view showing the semiconductor device at still another manufacturing step of the method for the manufacture of the semiconductor device shown in FIG. 1.
Figure 10:
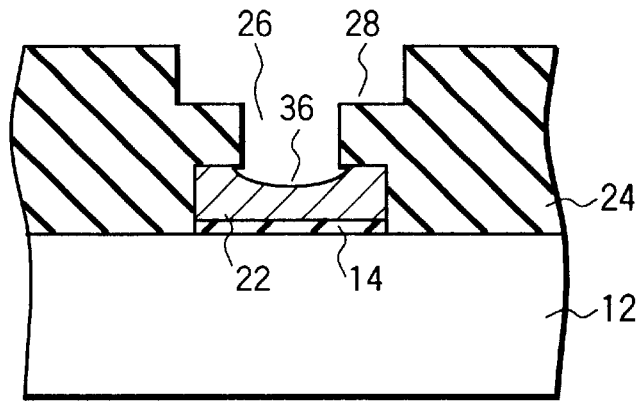
FIG. 10 is a sectional view showing the semiconductor device at still another manufacturing step of the method for the manufacture of the semiconductor device shown in FIG. 1.
Figure 11:
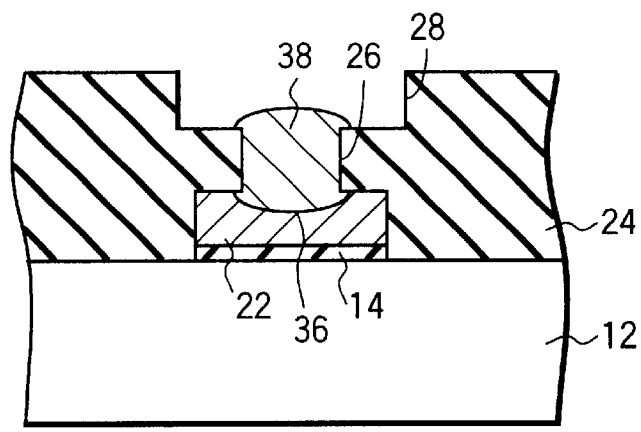
FIG. 11 is a sectional view showing the semiconductor device at still another manufacturing step of the method for the manufacture of the semiconductor device shown in FIG. 1.
Figure 12:
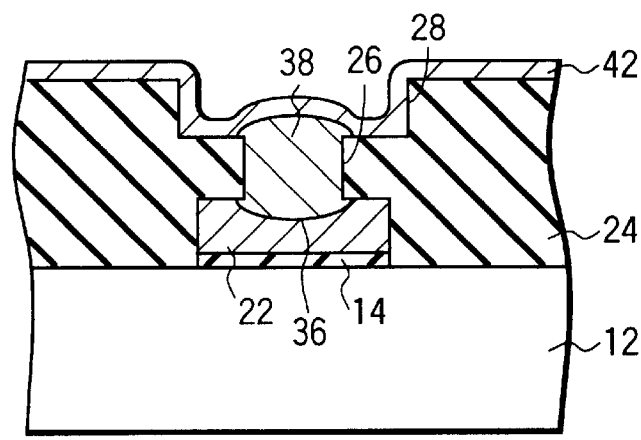
FIG. 12 is a sectional view showing the semiconductor device at still another manufacturing step of the method for the manufacture of the semiconductor device shown in FIG. 1.
Figure 13:
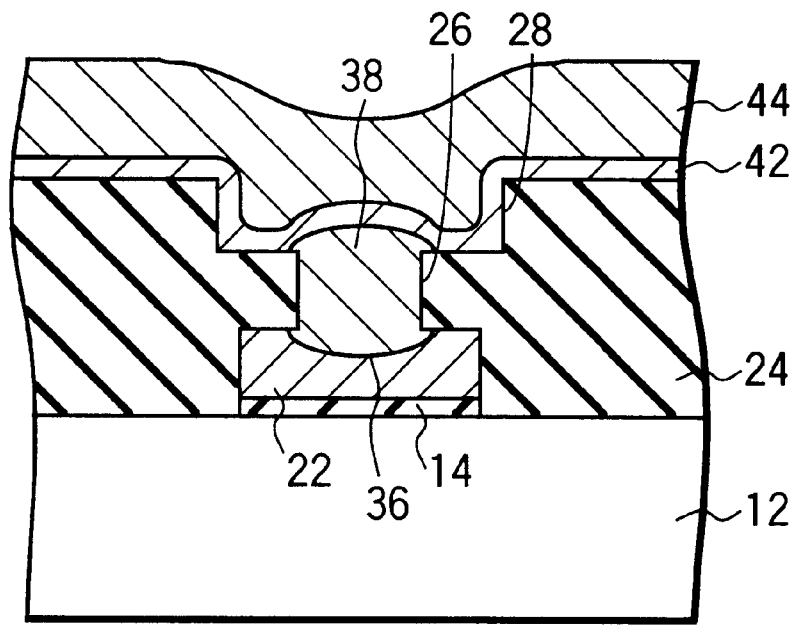
FIG. 13 is a sectional view showing the semiconductor device at still another manufacturing step of the method for the manufacture of the semiconductor device shown in FIG. 1.
Figure 14:
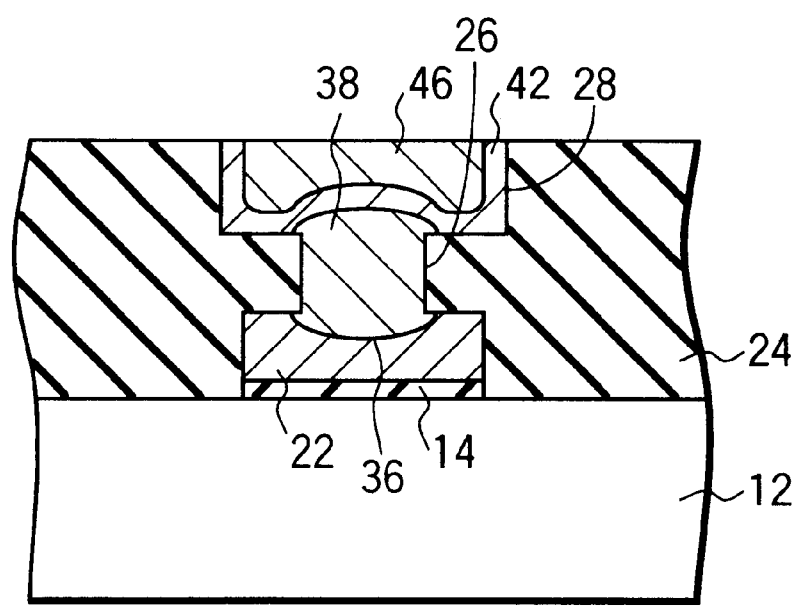
FIG. 14 is a sectional view showing the semiconductor device at still another manufacturing step of the method for the manufacture of the semiconductor device shown in FIG. 1.

As shown in FIG. 2, on the upper surface of a silicon (Si) semiconductor substrate 12, a barrier layer 14 composed of, e.g. $SiO_2$ is formed, and, on the barrier layer 14, an aluminum layer (or a layer composed of an aluminum compound) 16 which is a first wiring layer (a lower layer) is formed. As the material of the aluminum compound layer, for instance AlSi, AlCu, AlTi, etc. can be pointed out. Aluminum and aluminum compounds are low in reflowability but high in electric conductivity. Due to their high electric conductivity, they are popularly used as wiring material. The aluminum layer 16 and the barrier layer 14 are formed into predetermined patterns by the use of the RIE (Reactive Ion Etching) technique. That is, as shown in FIG. 3, a photo resist pattern 18 is formed on the aluminum layer 16, and then, by the use of the photo resist pattern 18 as a mask, the aluminum layer 16 and the barrier layer 14 are etched by the RIE technique, whereby a first (lower) aluminum wiring layer 22 is formed as shown in FIG. 4. Over the whole upper surface of the semiconductor substrate 12 which has the structure thus processed, an inter-layered insulation film 24 comprising an $SiO_2$ film is formed by the use of the CVD method. Then, formed in the inter-layered insulation film 24 are a groove 26 of the dual damascene structure (FIG. 9) and a via contact hole 28 (FIG. 9) by the RIE technique. That is, on the inter-layered insulation film 24, a photo resist pattern 31 is formed as shown in FIG. 7, and, by the use of this photo resist pattern 31 as a mask, the inter-layered insulation film 24 is etched to form a via contact hole 32 which leads to the first aluminum wiring layer 22. Subsequently, the photo resist pattern 31 is removed, and then, as shown in FIG. 8, a photo resist pattern 34 is further formed on the inter-layered insulation film 24. By the use of this photo resist pattern 34 as a mask, the inter-layered insulation film 24 is etched by the RIE technique, whereby, in a portion of the inter-layered insulation film 24 which portion includes the upper part of the via contact hole 32, a wide groove 28 is formed, whereby a dual damascene type via contact structure having the groove 28 and a via contact hole 26 lying below the groove 28 is formed. The via contact hole 26 and the groove 28 communicate with each other. The via contact hole 26 and the groove 28 also lead to the first aluminum wiring layer 22. Subsequently, by the use of a weak acid etchant or an alkaline enchant, the first aluminum wiring layer 22 is isotropically etched to a slight degree to form a shallow groove 36 in the surface area of the first aluminum wiring layer 22 as shown in FIG. 10. Then, by the use of the selective CVD (Chemical Vapor Deposition) method, the shallow groove 36 and the via contact hole 26 are filled up with tungsten to form a tungsten layer 38, as shown in FIG. 11. In this case, tungsten is deposited to overfill the via contact hole 26 such that the tungsten layer 38 extends upward from the upper surface of the via contact hole 26. Further, the tungsten layer 38 extends around beyond the extent of the upper surface of the via contact hole 26, that is, the tungsten layer 38 extends onto a portion of the surface of the inter-layered insulation film 24. As a result, the tungsten layer 38 has a main central portion formed in the via contact hole 26, an upper round portion extending upward from the upper surface of the via contact hole 26 and also extending around beyond the extent of the upper surface of the via contact hole 26, and a lower round portion formed in the shallow groove 36. The lower round portion extends downward from the lower surface of the via contact hole 26 and also extends around beyond the extent of the lower surface of the via contact hole 26. That is, the tungsten layer 38 has an upper round portion extending upward and around the upper surface of the via contact hole 26 and a lower round portion extending downward and around the lower surface of the via contact hole 26 and thus, the tungsten layer 38 is of a rivet-like shape as a whole. The tungsten layer 38, however, need not necessarily be formed so as to overfill around and, further, may be formed in a flat shape instead of the extending shape. Tungsten is high in reflowability and, also, high in electrical resistivity. Tungsten is high in electrical resistivity, indeed, but the tungsten layer 38 is formed substantially only within the via contact hole 26 under the groove 28 but not formed in the groove 28, so that the resistance value thereof is decreased. As shown in FIG. 12, an underlay layer (composed of, e.g. Ti) 42 for the reflowing of the aluminum is formed in such a manner that titanium is thinly deposited, by the use of the sputtering method or the CVD method, over the whole upper surface, that is, over the surfaces of the tungsten layer 38 and the inter-layered insulation film 24, of the semiconductor substrate 12 having the structure processed as mentioned above. As the material of the underlay layer for the reflowing of the aluminum, TiN, WN, etc. can be used in addition to Ti. Subsequently, as shown in FIG. 13, an aluminum reflow layer (second wiring layer) 44 is formed by thickly depositing aluminum, by the use of the CVD method, over the whole upper surface, that is, on the underlay layer 42 for the reflowing, of the semiconductor substrate 12 having the structure processed as mentioned above. This aluminum reflow layer 44 is then polished by the use of the CMP method, whereby a second (upper) aluminum wiring layer 46 is formed in the groove as shown in FIG. 14. As a result, the second (upper) aluminum wiring layer 46 and the first (lower) aluminum wiring layer 22 are electrically connected to each other through the tungsten layer 38 filling up the interior of the via contact hole. In this way, the semiconductor device with a dual damascene type via contact structure shown in FIG. 1 is manufactured.

According to the above-described embodiment, the via contact hole, that is, the deep filling portion is filled up with a metal having a high reflowability such as, e.g. tungsten, so that, in the via contact hole, an excellent filling layer 38 is formed. Since the via contact hole is thus filled up with the tungsten layer 38, the aluminum material forming the second wiring layer need not be formed so as to fill up even the via contact hole; that is, it suffices if only the shallow and wide groove is filled up with the second-layer aluminum material; that is, even if, as the material for filling up the shallow and wide groove, aluminum whose reflowability is not high is used, a sufficient filling can be provided. By combining the filling of the via contact hole with tungsten and the filling of the groove with aluminum as mentioned above, even the via contact having a high aspect ratio can be excellently filled up; that is, a high aspect ratio via contact filling can be realized. The material for filling up the via contact hole is not limited only to tungsten, but any other metal can be used in place of tungsten so long as it is high in reflowability. Copper for instance may be used.

Figure 15:
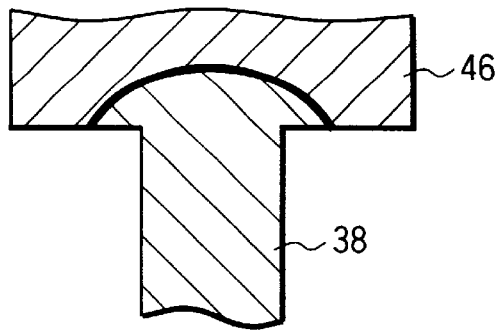
FIG. 15 is an enlarged view of the tungsten layer 38 in the semiconductor device shown in FIG. 1.
Figure 16:
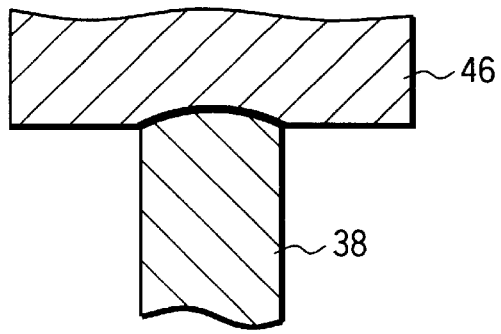
FIG. 16 is an enlarged view of a modification of the tungsten layer 38 in the semiconductor device shown in FIG. 1.
Figure 17:
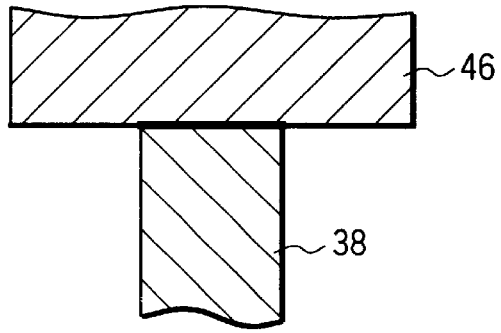
FIG. 17 is an enlarged view of another modification of the tungsten layer 38 in the semiconductor device shown in FIG. 1.

Further, according to the above-described embodiment, it is ensured that, when a high-temperature heat treatment is carried out for deposition of a metal material at the step for formation of the second wiring layer 44, the tungsten layer 38 formed in the via contact hole functions as a cap layer for preventing the conduction of heat to the first aluminum wiring layer 22, so that, at the time of the high-temperature heat treatment, the first aluminum wiring layer 22 is prevented from being melted. Thus, the present invention can be applied to the formation of a multi-layer wiring structure. FIG. 15 shows an enlarged view the upper-side portion of the tungsten layer 38 and the associated portion thereof. As shown in FIG. 14, the upper-side portion and the lower-side portion of the tungsten layer 38 are extended and rounded to form an opened umbrella shape, in other words, the interface between the tungsten layer 38 and the upper aluminum wiring layer 22 and the interface between the tungsten layer 38 and the lower aluminum layer 46 are in a curved face, respectively. Accordingly, the area of the interface between the tungsten layer 38 and the aluminum wiring layer 22 is increased. Similarly, the area of the interface between the tungsten layer 38 and the aluminum wiring layer 46 is also increased. Due to this, the electric current density in the interface between the tungsten layer 38 and the aluminum wiring layer 22 and the electric current density in the interface between the tungsten layer 38 and the aluminum wiring layer 46 reduced, so that the electro-migration through the via contact filling layer 38 is suppressed. The upper surface portion of the tungsten layer 38, however, need not necessarily be formed so as to extend around but may be formed only within the extent of the upper surface of the via contact hole 26, as shown in FIG. 16. Further, as shown in FIG. 17, the upper portion may still alternatively be formed flat without being extended upward and the surface of the upper portion may be flush with the surface of the lower surface of the via contact hole 26. In FIG. 16 and FIG. 17, the barrier layer between the tungsten layer 38 and the aluminum wiring layer is not shown for simplicity of illustration.

Figure 18:
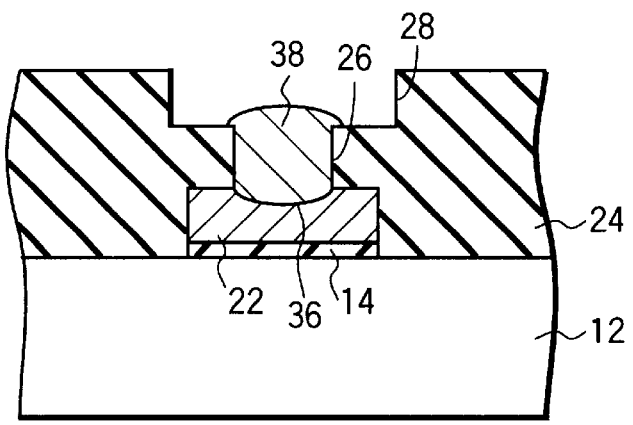
FIG. 18 is a sectional view diagram showing a semiconductor structure similar to the semiconductor structure shown in FIG. 11 but different from the latter in that the tungsten layer 38 is modified in respect of the shapes of the upper portion and the lower portion thereof.
Figure 19:
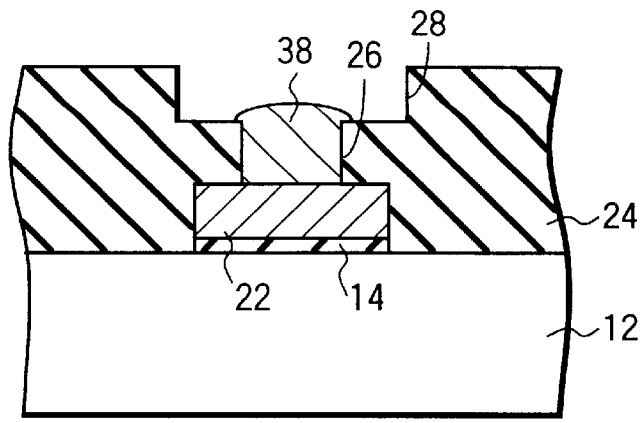
FIG. 19 is a sectional view showing a semiconductor structure similar to the semiconductor structure shown in FIG. 11 but different from the latter in that the tungsten layer 38 is modified in respect of the shapes of the upper portion and the lower portion thereof.
Figure 20:
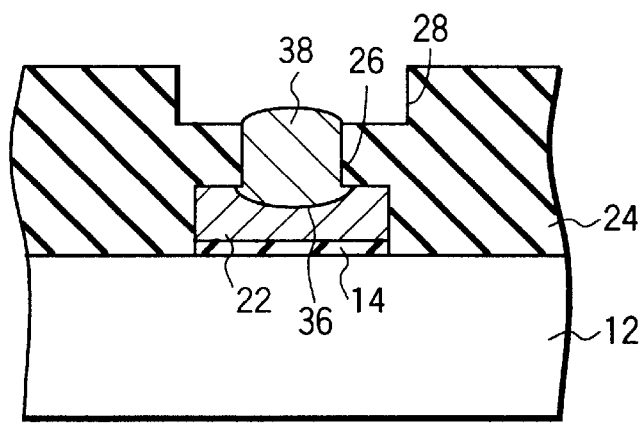
FIG. 20 is a sectional view showing a semiconductor structure similar to the semiconductor structure shown in FIG. 11 but different from the latter in that the tungsten layer 38 is modified in respect of the shapes of the upper portion and the lower portion thereof.
Figure 21:
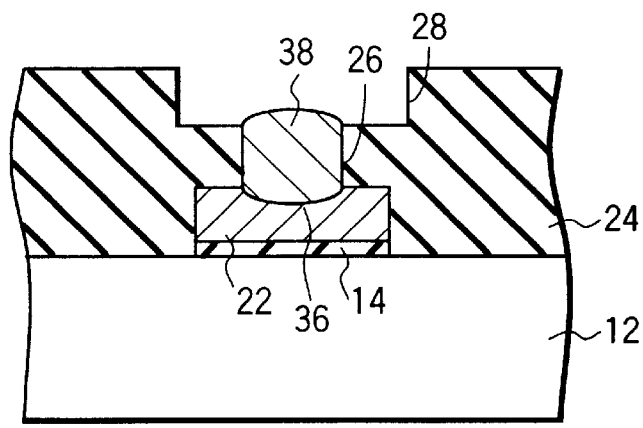
FIG. 21 is a sectional view showing a semiconductor structure similar to the semiconductor structure shown in FIG. 11 but different from the latter in that the tungsten layer 38 is modified in respect of the shapes of the upper portion and the lower portion thereof.
Figure 22:
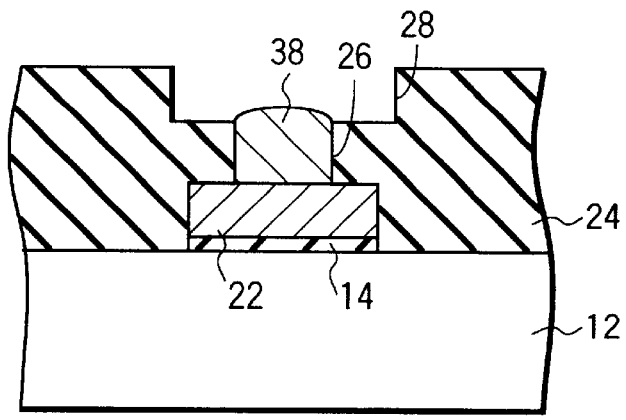
FIG. 22 is a sectional view showing a semiconductor structure similar to the semiconductor structure shown in FIG. 11 but different from the latter in that the tungsten layer 38 is modified in respect of the shapes of the upper portion and the lower portion thereof.
Figure 23:
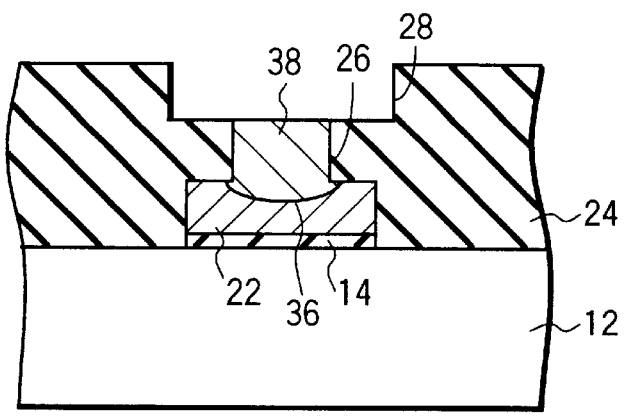
FIG. 23 is a sectional view showing a semiconductor structure similar to the semiconductor structure shown in FIG. 11 but different from the latter in that the tungsten layer 38 is modified in respect of the shapes of the upper portion and the lower portion thereof.
Figure 24:
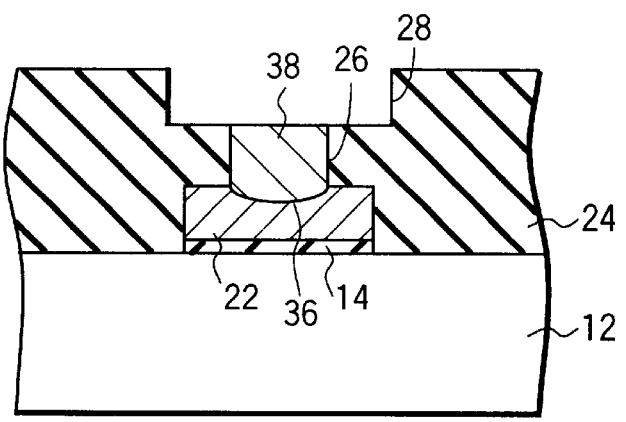
FIG. 24 is a sectional view showing a semiconductor structure similar to the semiconductor structure shown in FIG. 11 but different from the latter in that the tungsten layer 38 is modified in respect of the shapes of the upper portion and the lower portion thereof.
Figure 25:
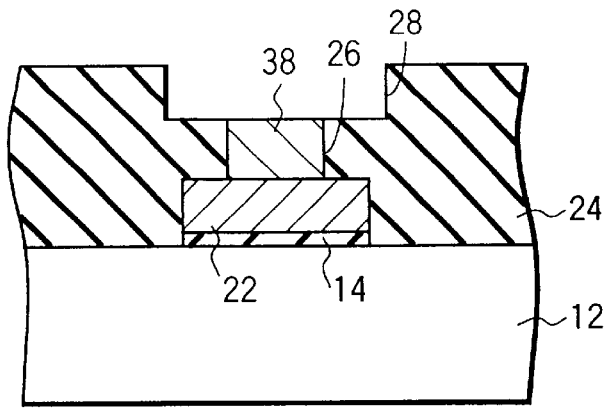
FIG. 25 is a sectional view showing a semiconductor structure similar to the semiconductor structure shown in FIG. 11 but different from the latter in that the tungsten layer 38 is modified in respect of the shapes of the upper portion and the lower portion thereof.

As shown in FIGS. 18 to 25, the above-mentioned shapes may also be employed in combination with reference to the upper-side portion and the lower-side portion of the tungsten layer 38. In the case of FIG. 18, the upper-side portion extends around, while the lower-side portion is formed only within the extent of the upper surface of the via contact hole 26 and extends upward to form a round shape. In the case of FIG. 19, the upper-side portion extends around, while the lower-side portion is flat and the surface thereof flush with the lower surface of the via contact hole 26. In the case of FIG. 20, the upper-side portion is formed only within the extent of the upper surface of the via contact hole 26 and extends upward to form a round shape, while the lower-side portion extends around. In the case of FIG. 21, the upper-side portion is formed only within the extent of the upper surface of the via contact hole 26 and extends upward to form a round shape. Similarly, the lower-side portion is formed only within the extent of the lower surface of the via contact hole 26 and extends downward to form a round shape. In the case of FIG. 22, the upper-side portion is formed only within the extent of the upper surface of the via contact hole 26 and extends upward to form a round shape, while the lower-side portion is flat and the surface thereof flush with the lower surface of the via contact hole 26. In the case of FIG. 23, the upper-side portion is flat and the surface thereof flush with the upper surface of the via contact hole 26, while the lower-side portion extends around. In the case of FIG. 24, the upper-side portion is flat and the surface thereof flush with the upper surface of the via contact hole 26, while the lower-side portion is formed only within the extent of the lower surface of the via contact hole 26 and extends downward to form a round shape. In the case of FIG. 25, the upper-side portion is flat and the surface thereof flush with the upper surface of the via contact hole 26, and similarly, the lower-side portion is flat and the surface thereof flush with the lower surface of the via contact hole 26. The shapes of the upper-side portion and the lower-side portion of the tungsten layer 38 are variously modified as shown in FIGS. 18 to 25, however the tungsten layer 38 should desirably be formed in such a manner as described in the embodiment referring to FIG. 1, that is, in such a manner that the upper-side portion extends around and extends upward from the upper surface of the via contact hole 26 and the lower-side portion extends around and extends downward from the lower surface of the via contact hole 26.

Figure 26:
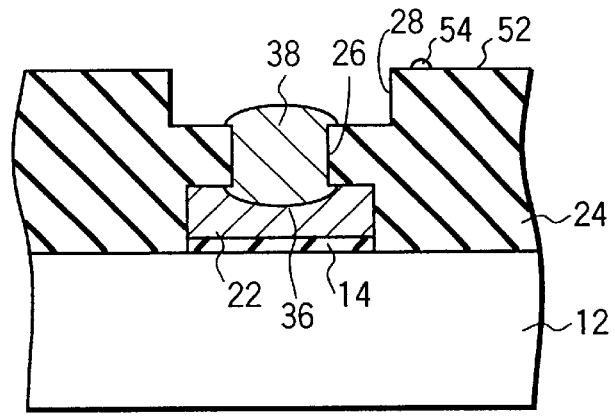
FIG. 26 is a sectional view showing a semiconductor structure similar to the semiconductor structure shown in FIG. 11, but a portion 54 of the tungsten layer 38 which is formed in an undesirable part 52 (the upper surface of the inter-layered insulation film 24) is additionally shown.
Figure 27:
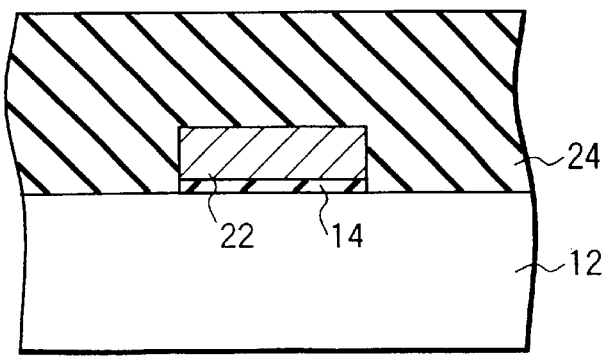
FIG. 27 is a sectional view showing the semiconductor structure—at a manufacturing step of a conventional manufacturing method employing the RIE technique—of a semiconductor device having a via contact structure.
Figure 28:
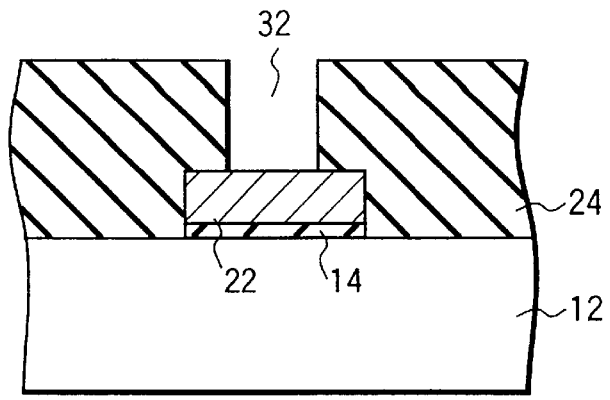
FIG. 28 is a sectional view showing the semiconductor structure—at another manufacturing step of the conventional manufacturing method employing the RIE technique—of a semiconductor device having a via contact structure.
Figure 29:
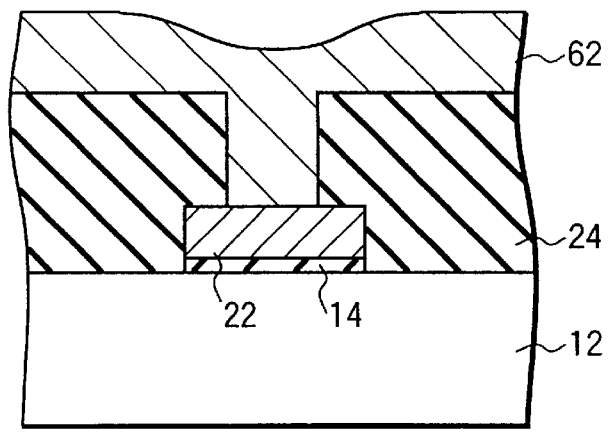
FIG. 29 is a sectional view showing the semiconductor structure—at still another manufacturing step of the conventional manufacturing method employing the RIE technique—of a semiconductor device having a via contact structure.
Figure 30:
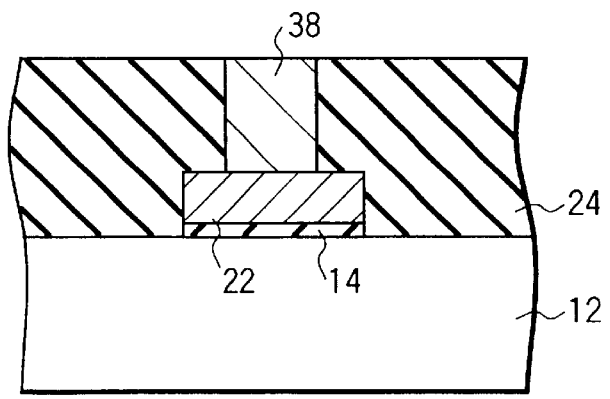
FIG. 30 is a sectional view showing the semiconductor structure—at still another manufacturing step of the conventional manufacturing method employing the RIE technique—of a semiconductor device having a via contact structure.
Figure 31:
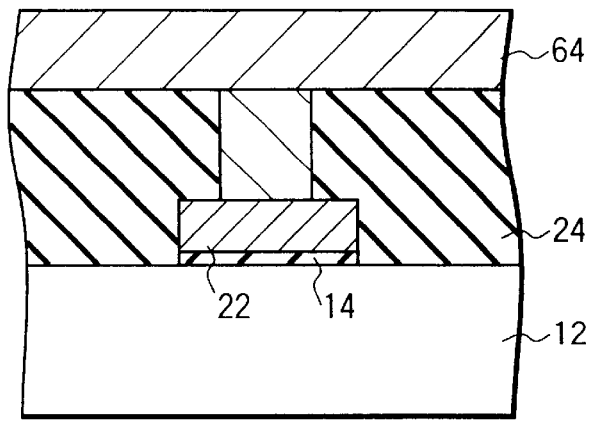
FIG. 31 is a sectional view showing the semiconductor structure—at still another manufacturing step of the conventional manufacturing method employing the RIE technique—of a semiconductor device having a via contact structure.
Figure 32:
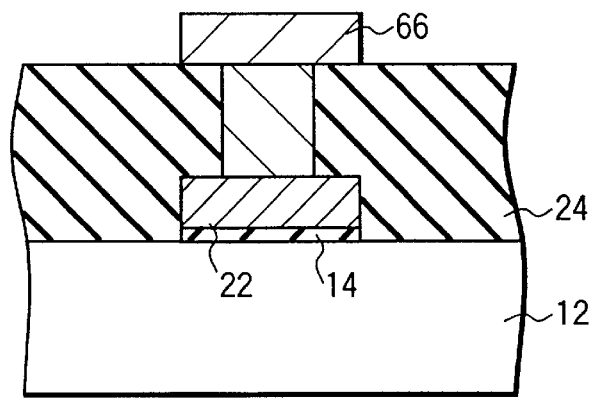
FIG. 32 is a sectional view showing the semiconductor structure—at still another manufacturing step of the conventional manufacturing method employing the RIE technique—of a semiconductor device having a via contact structure.
Figure 33:
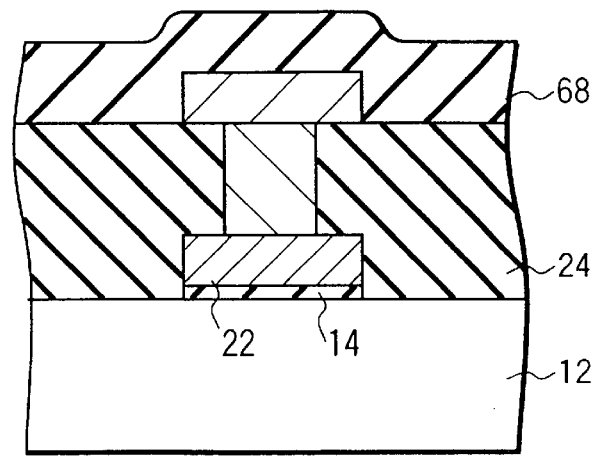
FIG. 33 is a sectional view showing the semiconductor structure—at still another manufacturing step of the conventional manufacturing method employing the RIE technique—of a semiconductor device having a via contact structure.
Figure 34:
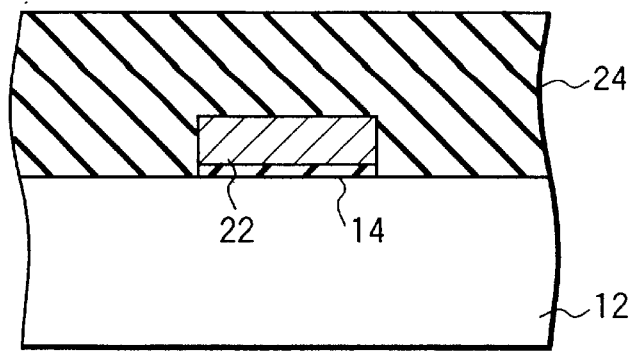
FIG. 34 is a sectional view showing the semiconductor structure—at a manufacturing step of a conventional manufacturing method employing the dial damascene technique—of a semiconductor device having a via contact structure.
Figure 35:
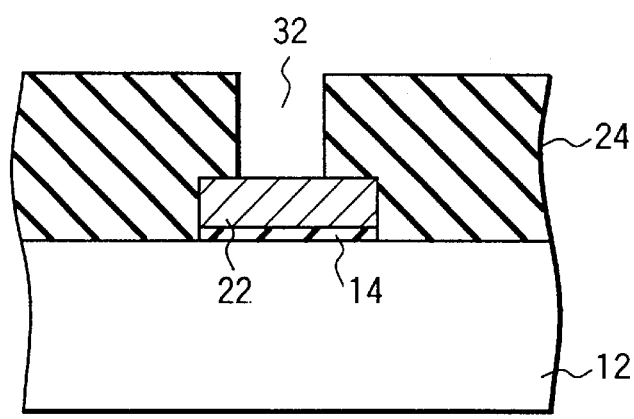
FIG. 35 is a sectional view showing the semiconductor structure—at another manufacturing step of the conventional manufacturing method employing the dual damascene technique—of a semiconductor device having a via contact structure.
Figure 36:
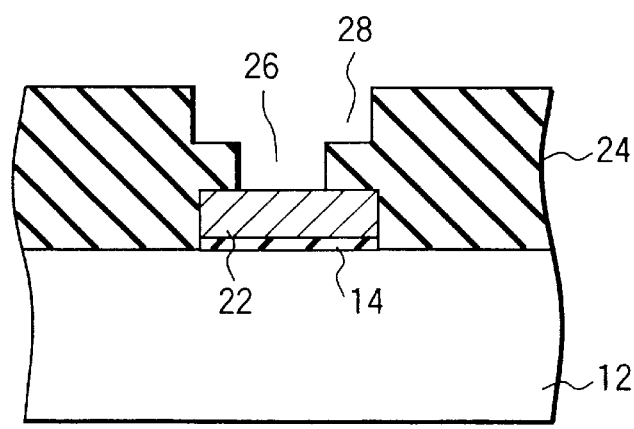
FIG. 36 is a sectional view showing the semiconductor structure—at still another manufacturing step of the conventional manufacturing method employing the dual damascene technique—of a semiconductor device having a via contact structure.
Figure 37:
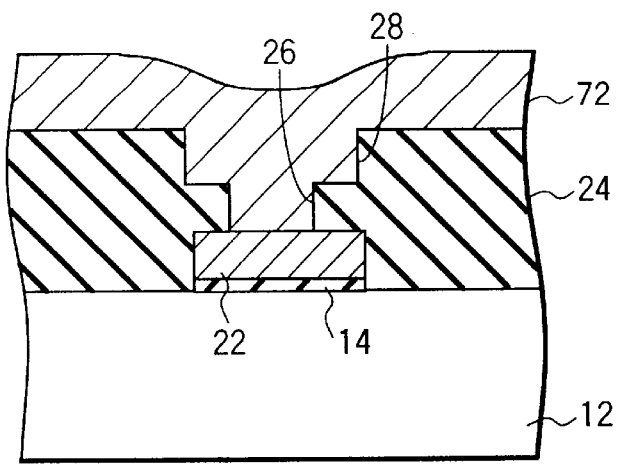
FIG. 37 is a sectional view showing the semiconductor structure—at still another manufacturing step of the conventional manufacturing method employing the dual damascene technique—of a semiconductor device having a via contact structure.
Figure 38:
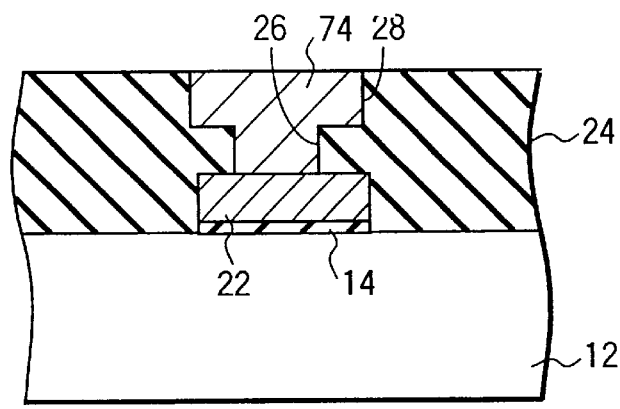
FIG. 38 is a sectional view showing the semiconductor structure—at still another manufacturing step of the conventional manufacturing method employing the dual damascene technique—of a semiconductor device having a via contact structure.
Figure 39:
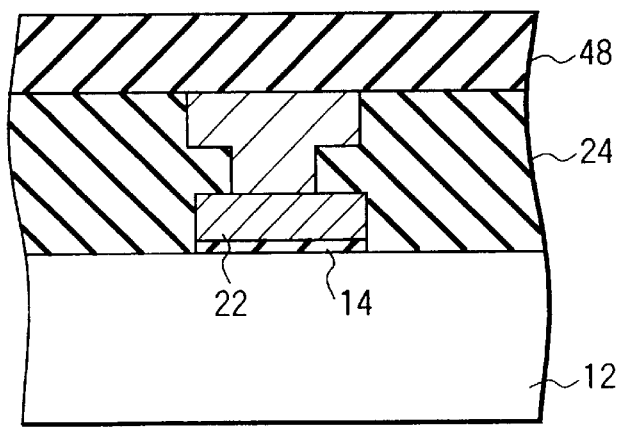
FIG. 39 is a sectional view showing the semiconductor structure—at still another manufacturing step of the conventional manufacturing method employing the dual damascene technique—of a semiconductor device having a via contact structure.

Further, a portion 54 of the tungsten layer 38 which portion has been formed on an undesirable portion 52 (the upper surface of the inter-layered insulation film 24) due to an imperfect selection at the time of performing the selective CVD treatment of the tungsten as shown in FIG. 26 is removed when the aluminum reflow layer for the formation of the second aluminum wiring layer 46 is polished by the use of the CMP method, whereby the occurrence of an undesirable short-circuit which would be caused by the portion of the tungsten layer 38 if the portion of the tungsten layer 38 were left can be prevented.

As has been described above, according to the present invention, there is provided a semiconductor device with a dual damascene type via contact structure which is constituted in such a manner that an excellent high-aspect-ratio via contact filling can be realized, and in addition, there is no fear that, at the time of depositing a metal material for the formation of the upper metal wiring layer, the lower metal wiring layer may be melted due to the high-temperature heat treatment carried out; and thus, this structure is applicable to a multi-layer wiring structure. According to the present invention, a method for the manufacture of said semiconductor device can also be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A semiconductor device with a dual damascene type via contact structure, comprising:
   a first metal wiring formed on a semiconductor substrate;
   a single inter-layered insulation film formed on the semiconductor substrate including the first metal wiring;
   a dual damascene structure having a groove and a via contact hole which are formed in the inter-layered insulation film and lead to the first metal wiring;
   a via contact filling layer of a first metal material filled in the via contact hole of the dual damascene structure formed in the inter-layered insulation film, said via contact filling layer being in contact with the first metal wiring; and
   a second metal wiring of a second metal material filled in the groove of the dual damascene structure, the groove being in contact with the via contact filling layer, the second metal material filled in the groove being different from the first metal material being filled in the via contact hole.

2. A semiconductor device with a dual damascene type via contact structure according to claim 1,
   wherein the first metal wiring has a groove formed in the surface area thereof through the groove and the via contact hole of the dual damascene structure, and
   the filling material fills up the interior of the groove in the surface area of said first metal wiring.

3. A semiconductor device with a dual damascene type via contact structure according to claim 2, wherein the via contact filling layer is formed in the shape of a rivet.

4. A semiconductor device with a dual damascene type via contact structure according to claim 1, wherein the via contact filling layer is composed of a metal which has a high reflowability.

5. A semiconductor device with a dual damascene type via contact structure according to claim 1, wherein the via contact filling layer is composed of a metal which has a low thermal conductivity.

6. A semiconductor device with a dual damascene type via contact structure according to claim 1, wherein the first metal wiring and the second metal wiring are composed of a metal which has a high electrical conductivity.

7. A semiconductor device with a dual damascene type via contact structure according to claim 1, wherein said semiconductor device further comprises a barrier layer formed on the via contact filling layer and the inter-layered insulation film.

8. A semiconductor device with a dual damascene type via contact structure according to claim 7, wherein the barrier layer is composed of Ti, TiN or WN.

9. A semiconductor device with a dual damascene type via contact structure comprising:
   an inter-layered insulation film formed on an underlying wiring;
   a dual damascene structure having a groove and a via contact hole which are formed in the inter-layered insulation film and lead to the underlying wiring;
   a groove formed in the surface area of the underlying wiring through the groove and the via contact hole of the dual damascene structure;
   a rivet shape via contact filling layer formed in such a manner that the interior of the via contact hole of the dual damascene structure formed in the inter-layered insulation film and the interior of the groove of the dual damascene structure formed in the surface area of the underlying wiring are filled up with a filling material until said via contact filling layer extends upward from the upper surface of the via contact hole and extends around the upper surface of the via contact hole; and
   an upper-layered wiring formed in the groove of the dual damascene structure, the upper-layered wiring being contacted with the via contact filling layer.

10. A semiconductor device with a dual damascene type via contact structure according to claim 9, wherein the via contact filling layer is composed of a metal which has a high reflowability.

11. A semiconductor device with a dual damascene type via contact structure according to claim 9, wherein the via contact filling layer is composed of a metal which has a low thermal conductivity.

12. A semiconductor device with a dual damascene type via contact structure according to claim 9, wherein the underlying wiring and the upper-layer wiring are composed of a metal which has a high electrical conductivity.

13. A semiconductor device with a dual damascene type via contact structure according to claim 9, wherein said semiconductor device further comprises a barrier layer formed on the via contact filling layer and the inter-layered insulation film.

14. A semiconductor device with a dual damascene type via contact structure according to claim 13, wherein the barrier layer is composed of Ti, TiN or WN.

15. A semiconductor device with a dual damascene type via contact structure, comprising:
   a first metal wiring formed on a semiconductor substrate;
   an inter-layered insulation film formed on the semiconductor substrate including the first metal wiring;
   a dual damascene structure having a groove and a via contact hole which are formed in the inter-layered insulation film and lead to the first metal wiring;
   a via contact filling layer formed by filling up, with a metal material, the interior of the via contact hole of the dual damascene structure formed in the inter-layered insulation film, said via contact filling layer being in contact with the first metal wiring; and
   a second metal wiring formed in the groove of the dual damascene structure, the groove being in contact with the via contact filling layer, wherein
   the first metal wiring has a groove formed in the surface area thereof through the groove and the via contact hole of the dual damascene structure,
   the filling material fills up the groove in the surface area of the first metal wiring, and
   the via contact filling layer is formed in the shape of a rivet.

16. A semiconductor device with a dual damascene type via contact structure, comprising:
   a first metal wiring formed on a semiconductor substrate;
   a single inter-layered insulation film formed on the semiconductor substrate including the first metal wiring;
   a dual damascene structure having a groove and a via contact hole which are formed in the inter-layered insulation film and lead to the first metal wiring;
   a via contact filling layer filled in the via contact hole of the dual damascene structure formed in the inter-layered insulation film, said via contact filling layer being in contact with the first metal wiring; and
   a second metal wiring filled in the groove of the dual damascene structure, the groove being in contact with the via contact filling layer.

* * * * *